United States Patent
Jung et al.

(10) Patent No.: US 6,384,390 B1
(45) Date of Patent: May 7, 2002

(54) APPARATUS FOR FORMING THIN FILM USING MICROWAVE AND METHOD THEREFOR

(75) Inventors: Sun-tae Jung, Seoul; Dong-wook Shin, Suwon; Hyoun-soo Kim, Sungnam, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/663,418

(22) Filed: Sep. 15, 2000

Related U.S. Application Data

(62) Division of application No. 09/223,718, filed on Dec. 31, 1998.

(30) Foreign Application Priority Data

Dec. 31, 1997 (KR) ............................................. 97-82049

(51) Int. Cl.[7] ................................................. H05B 6/64
(52) U.S. Cl. ...................................... 219/679; 219/686
(58) Field of Search .............................. 219/679, 710, 219/712, 678, 756, 762, 686; 118/724, 725, 728, 723 MW; 427/591, 595, 163.2, 575; 117/95, 108; 65/386

(56) References Cited

U.S. PATENT DOCUMENTS

| | | | |
|---|---|---|---|
| 4,147,911 A | | 4/1979 | Nishitani |
| 4,168,998 A | * | 9/1979 | Hasegawa et al. ............. 117/95 |
| 4,307,277 A | | 12/1981 | Maeda et al. |
| 4,667,076 A | | 5/1987 | Amada |
| 4,941,905 A | | 7/1990 | Narasimham |
| 4,963,709 A | | 10/1990 | Kimrey, Jr. |
| 5,141,549 A | * | 8/1992 | Tumminelli ................. 65/386 |
| 5,202,541 A | | 4/1993 | Patterson et al. |
| 5,254,374 A | | 10/1993 | Devlin et al. |
| 5,427,826 A | * | 6/1995 | Iida ............................. 427/575 |
| 5,620,512 A | * | 4/1997 | Gruen et al. ................. 117/108 |
| 5,698,901 A | | 12/1997 | Endo |
| 5,796,079 A | | 8/1998 | Kim et al. |
| 5,800,860 A | * | 9/1998 | Kilian et al. ............. 427/163.2 |

FOREIGN PATENT DOCUMENTS

| | | |
|---|---|---|
| EP | 0092346 A1 | 10/1983 |
| GB | 2106709 A | 4/1983 |
| GB | WO93/12629 A | 6/1993 |
| JP | 3-22430 | 1/1991 |
| JP | 3-72656 | 3/1991 |
| JP | 4-93029 | 3/1992 |

* cited by examiner

Primary Examiner—Teresa Walberg
Assistant Examiner—Quang Van
(74) Attorney, Agent, or Firm—Robert E. Bushnell, Esq.

(57) ABSTRACT

An apparatus for forming a thin film using microwave and a method therefor are provided. The apparatus for forming a thin film on a wafer by densifying predetermined soot on a wafer, when the wafer and the soot form a sample, includes a microwave sintering furnace for sealing the sample and exposing the sample to microwave, thus sintering the sample, a sintering furnace atmosphere maker for controlling the state, being the atmosphere of air inside the microwave sintering furnace, a temperature sensor/controller for sensing a temperature inside the microwave sintering furnace, comparing the temperature with a predetermined reference temperature, and outputting an error temperature, and a microwave power source for generating microwave of a predetermined temperature with reference to the error temperature output from the temperature sensor/controller and applying the microwave to the microwave sintering furnace. It is possible to rapidly form a film of a fine and uniform structure by densification using microwave.

14 Claims, 2 Drawing Sheets

APPARATUS FOR FORMING THIN FILM USING MICROWAVE AND METHOD THEREFOR

CROSS-REFERENCE TO RELATED APPLICATIONS

This application is a divisional application of applicant's Ser. No. 09/223,718 filed in the U.S. Patent & Trademark Office on Dec. 31, 1998, and assigned to the assignee of the present invention.

CLAIM OF PRIORITY

This application makes reference to, incorporates the same herein, and claims all benefits accruing under 35 U.S.C. §119 from my application entitled APPARATUS FOR FORMING THIN FILM USING MICROWAVE AND METHOD THEREFOR filed with the Korean Industrial Property office on the Dec. 31, 1997 and there duly assigned Ser. No. 97-82049 by that Office.

BACKGROUND OF THE INVENTION

1. Field of the Invention

The present invention relates to an apparatus for forming a thin film and a method therefor, and more particularly, to an apparatus for forming a thin film using microwave and a method therefor.

2. Description of the Related Art

Flame hydrolysis deposition (FHD), chemical vapor deposition (CVD), modified chemical vapor deposition (MCVD), physical vapor deposition (PVD), sputtering, e-beam evaporation deposition, and a spin coating method are generally used to form a thin film on a wafer. The thickness, the deposition speed, and the density of the thin film are controlled according to variables such as materials used, mixture of materials, velocity of a moving fluid, temperature, plasma output, voltage, and rotation number when the thin film is deposited using the above methods.

In one method of manufacturing a thin film according to a conventional flame hydrolysis deposition (FHD) method, silica soot is formed on a wafer using the FHD method. When the film is formed by the FHD method, it is necessary to undergo a high temperature thermal process. The high temperature thermal process is performed using a resistance heating furnace. The high temperature thermal process is for densifying the soot. First, the wafer and the soot are heated at a temperature of between about 800° C. and 1,350° C. The temperature is maintained for one to three hours. The thin film is formed through a cooling process.

In the processes of manufacturing the thin film according to the above FHD method, the process of densifying the soot by a resistance heating method is lengthy. It takes four to six hours to heat the soot and the high temperature is maintained for one to two hours. It takes about 15 hours overall to heat the soot, to maintain the high temperature, and to lower the temperature from above 800° C. to room temperature. Since a heating source such as a resistance heating furnace delivers heat from outside a sample (the wafer and the soot thereon) to be heated, the temperature outside of the sample rises faster than that inside of the sample. Accordingly, the temperature of the surface of the stacked soot becomes higher than the temperature of an interface which contacts the soot and the wafer. Gas which is not emitted to the outside due to a difference of temperatures between the surface of the soot and the interface layer may form blisters inside the soot layer. Also, when a multilayer film is formed using the resistance heating furnace, heat at the same temperature is applied to the wafer, the previously formed films, and the entire soot to be newly densified. Accordingly, cracking due to thermal stress may occur between films of different components.

SUMMARY OF THE INVENTION

It is therefore an object of the present invention to provide an improved apparatus and method for forming thin films on a wafer.

It is a further object of the present invention to provide an apparatus and method which allow for faster densification of a thin film.

It is a yet further object of the present invention to provide an apparatus and method in which blistering of the film during thermal treatment is prevented.

It is a still further object of the present invention to provide an apparatus and method in which cracking of the film due to thermal stress is prevented.

To achieve the above objects, the present invention provides an apparatus and a method for forming a thin film using microwave in which the film is rapidly densified using microwave radiation as a heating source when a single layer film or a multilayer film is formed on a wafer. Accordingly, an apparatus for forming a thin film on a wafer by densifying predetermined soot on a wafer, when the wafer and the soot form a sample, includes a microwave sintering furnace for sealing the sample and exposing the sample to microwave, thus sintering the sample, a sintering furnace atmosphere maker for controlling the state, being the atmosphere of air inside the microwave sintering furnace, a temperature sensor/controller for sensing a temperature inside the microwave sintering furnace, comparing the temperature with a predetermined reference temperature, and outputting an error temperature, and a microwave power source for generating microwave of a predetermined temperature with reference to the error temperature output from the temperature sensor/controller and applying the microwave to the microwave sintering furnace.

The sintering furnace atmosphere maker preferably can evacuate the inside of the microwave sintering furnace. The microwave sintering furnace atmosphere maker preferably can provide an atmosphere of a predetermined component to the microwave sintering furnace.

The microwave sintering furnace preferably includes an insulating material surrounding the sample in order to prevent heat from being emitted in a process of densifying the soot. The insulating material is preferably a high temperature ceramic insulating material.

It is preferable that the microwave sintering furnace further includes a predetermined supporter connected to the temperature sensor/controller for supporting the sample inside the insulating material.

A method for forming a film on a wafer using microwave includes the steps of manufacturing soot of a predetermined component on a wafer, heating the soot by applying microwave, maintaining the temperature of the heated soot for a predetermined time, and completing the film by cooling the soot. The soot is preferably a silica soot.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE DRAWINGS

Figure 1:
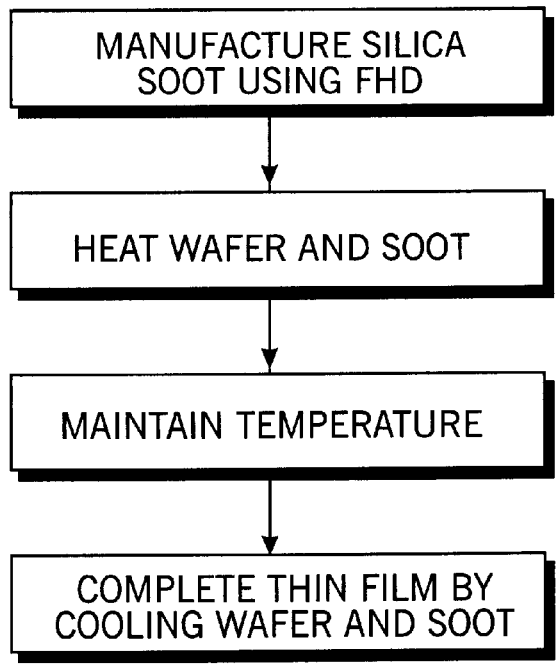
FIG. 1 is a flowchart of a method of manufacturing a thin film by a conventional flame hydrolysis deposition (FHD) method.

Turning now to the drawings, FIG. 1 is a flowchart illustrating manufacturing a thin film according to a conventional flame hydrolysis deposition FHD) method. Silica soot is formed on a wafer using the FHD method (step 100). When the film is formed by the FHD method, it is necessary to undergo a high temperature thermal process. The high temperature thermal process is performed using a resistance heating furnace. The high temperature thermal process is for densifying the soot. First, the wafer and the soot are heated at a temperature of between about 800° C. and 1,350° C. (step 110). The temperature is maintained for one to three hours (step 120). The thin film is formed through a cooling process (step 130).

Figure 2:
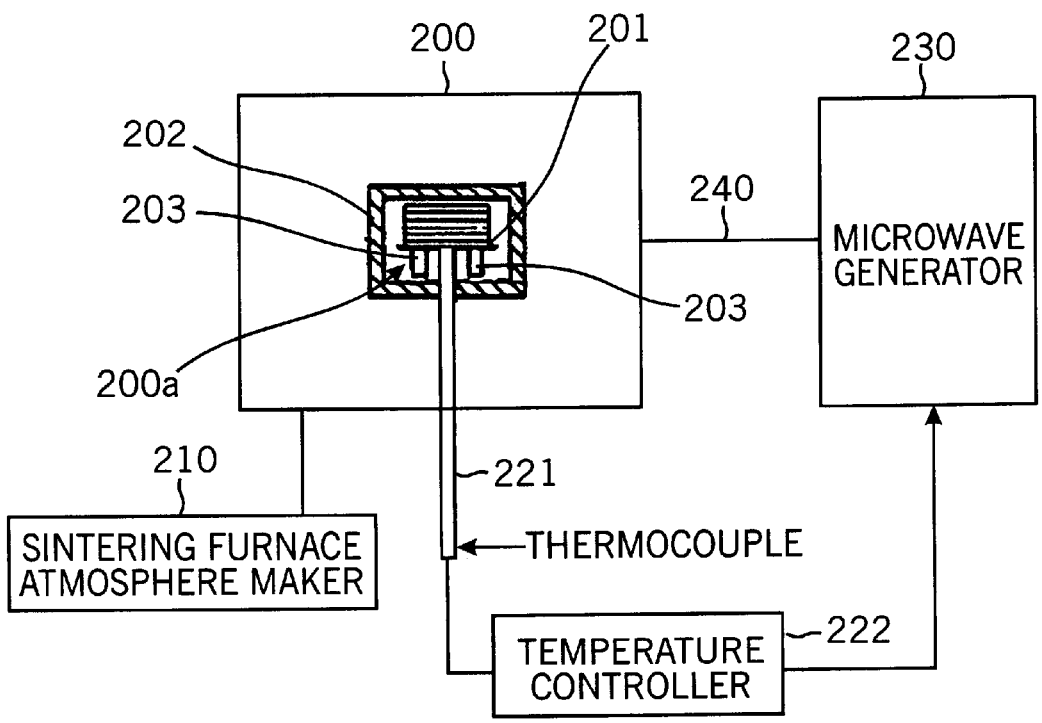
FIG. 2 shows the structure of an apparatus for forming a thin film using microwave according to the present invention.

Hereinafter, the present invention will be described in detail with reference to the attached drawings. FIG. 2 shows the structure of an apparatus for forming a thin film using microwave radiation according to the present invention. The apparatus for forming the film using the microwave radiation for forming the film on a wafer by densifying a predetermined component of soot stacked on the wafer includes microwave sintering furnace 200, sintering furnace atmosphere maker 210, temperature sensor/controller 221, 222, and microwave power source 230. Microwave sintering furnace 200 is a chamber 200 for sealing a wafer on which soot is put (a sample) and exposing the sample to microwave in a sealed space, thus sintering the sample. The microwave radiation enters through microwave induction pipe 240 connected to microwave sintering furnace 200. The microwave radiation more directly transmits heat to the sample inside microwave sintering furnace 200 by internal volumetric heating rather than by conduction and radiation which are the thermal transmitting modes when the conventional resistance heating furnace is used. It is possible to rapidly and uniformly fire a large and complicated sample by firing the sample using microwave radiation. When the soot is fired, thermal stress between different materials, for example, the wafer and the soot, which may be generated when the temperature rises or falls, is reduced. Accordingly, a film of a uniform and fine structure, which is not cracked, is formed.

Microwave sintering furnace 200 forming a chamber further includes within the chamber insulating material 202 surrounding sample 201, thus densifying the soot. Accordingly, the emission of heat is prevented in the process of forming the film. Insulating material 202 is preferably formed of a heat resistant high temperature ceramic insulating material which is not transformed by the strong microwave radiation. Insulating material 202 prevents the heat emitted by the wafer and the soot on the wafer from leaking out, thus helping to maintain a certain temperature. Supporter 203 inside insulating material 202 supports sample 201. Supporter 203 should not react first or should not be transformed when sample 201, i.e., the wafer and the soot, performs a predetermined thermal operation by the microwave. Supporter 203 is formed of a material which prevents heat from escaping and does not react to the wafer put thereon at a high temperature. Sintering furnace atmosphere maker 210 for controlling the state of the air or the atmosphere inside the microwave sintering furnace 200, may evacuate the microwave sintering furnace if necessary and, when it is necessary to make a predetermined atmosphere inside microwave sintering furnace 200, provides the necessary air component to microwave sintering furnace 200. Temperature sensor/controller 221, 222 inside microwave sintering furnace 200 for sensing and controlling the temperature inside microwave sintering furnace 200 includes thermocouple 221 for detecting the temperature within a portion 200a of the chamber 200 surrounded by insulating material 202 that surrounds the sample 201 and temperature controller 222 for comparing the temperature detected by thermocouple 221 with a predetermined desired reference temperature and calculating the error temperature, that is, the difference between the measured temperature and the desired temperature. Microwave generator 230 applies the microwave to the inside of microwave sintering furnace 200. The power of the microwave to be applied is calculated by adding power according to the error temperature from temperature sensor/controller 221, 222 to the previously generated power or subtracting power according to the error temperature from temperature sensor/controller 221, 222 from the previously generated power.

As shown in FIG. 2, when the sample is heated using the microwave, the speed at which the sample is heated and cooled becomes higher than when the sample is heated using the resistance heating furnace of FIG. 1. Accordingly, it is possible to form a film on the wafer in a short time and to form a film of a fine structure since blisters are not generated in the interlayer of the soot according to the heating method.

Figure 3:
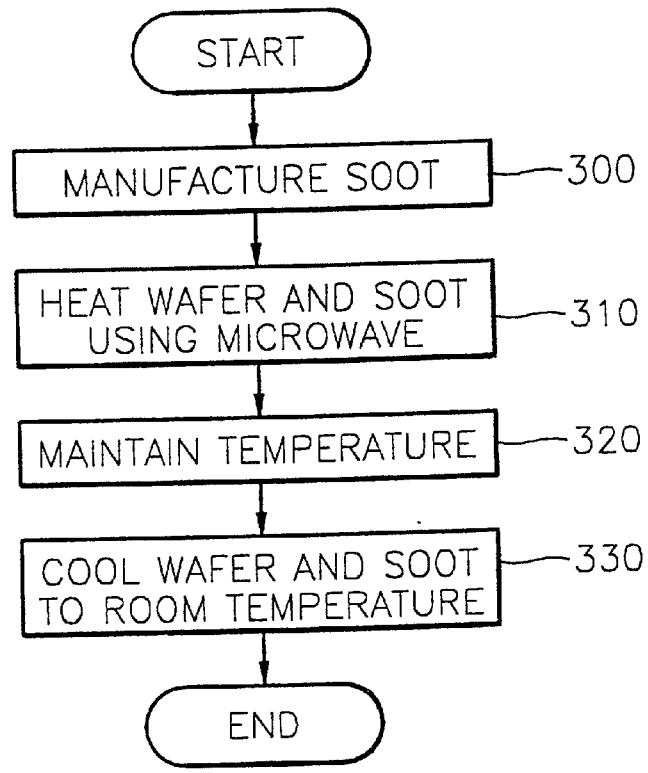
FIG. 3 is a flowchart of a method of forming a film using microwave according to the present invention.

FIG. 3 is a flowchart of a method for forming a film using microwave according to the present invention. In the method for forming the film on the wafer using the microwave, a predetermined component of soot is manufactured on the wafer (step 300). For example, soot of a silica component (silica soot) is formed on the wafer by the FHD method by flowing under the flame of hydrogen and oxygen, silica, and $SiCl_4$, $BCl_3$, $POCl_3$, and $GeCl_4$ which are main materials of mixture to the wafer. The soot formed as mentioned above is not attached to the wafer and the soot particles are not firmly combined to one another. The soot and the wafer are heated by applying the microwave (step 310). After maintaining the predetermined temperature of the heated soot and wafer for a certain time (step 320) and cooling the soot and the wafer to a room temperature (step 330), a thin film is formed on the wafer. The multilayer is formed by repeating the above processes as many times as required for desired layers of the thin film to be formed on the thin film formed by the processes of FIG. 3.

Figure 4A:
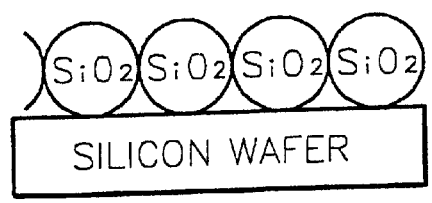
FIGS. 4A through 4C show processes of densifying silica soot according to the process of FIG. 3.
Figure 4B:
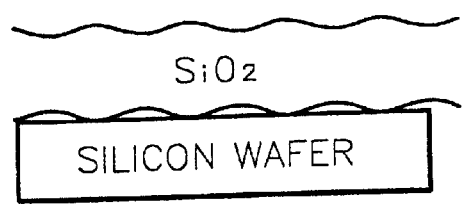
Figure 4C:
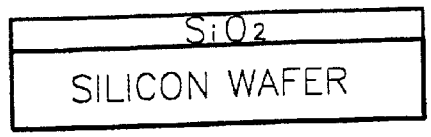

FIGS. 4A through 4C show processes of densifying the silica soot by the processes of FIG. 3. FIG. 4A shows a state in which the silica soot is manufactured on the silicon wafer in step 300 of FIG. 3. In this step, the silica soots are not combined with one another and stacked on the wafer. FIG. 4B shows the state of the sample when the silica soot and the silicon wafer are heated and maintained at a predetermined temperature using the microwave in steps 310 to 320 of FIG. 3. In these steps, the silica soots are firmly combined with one another. FIG. 4C shows a state in which the silica thin film is formed on the silicon wafer after the cooling step 330 of FIG. 3.

Since the entire sample is heated by the internal volumetric heating method in the microwave sintering, the generation of blisters is prevented. Therefore, it is possible to manufacture a uniform silica film without inner stress and blisters. Also, the time taken to sinter the sample is reduced due to the rapid rising and falling of temperature characteristic of the microwave sintering. Accordingly, the thin film is rapidly formed. According to the present invention, it is possible to rapidly form a film of a fine and uniform structure by densification using microwave.

What is claimed is:

1. A method of forming a film on a wafer, comprising the steps of:

depositing a soot on a wafer to form a sample;

sealing said sample inside a chamber of a microwave sintering furnace and surrounding said sample with an insulating material inside said chamber;

applying microwave radiation to said sample surrounded by said insulating material inside said chamber of said microwave sintering furnace to heat said sample by internal volumetric heating;

controlling a temperature of said sample by measuring a temperature within a portion of said chamber that is surrounded by said insulating material to provide a measured temperature and controlling said applying of said microwave radiation based upon the measured temperature to maintain a desired temperature for a predetermined amount of time; and allowing said sample to cool.

2. The method of claim 1, further comprising the step of placing said sample inside said insulating material before said step of applying microwave radiation.

3. The method of claim 1, further comprised of said soot being a silica soot.

4. The method of claim 1, further comprised of said step of depositing a soot comprising a flame hydrolysis deposition method.

5. The method of claim 1, further comprising the step of:

repeating said steps of depositing a soot, applying microwave radiation, controlling a temperature of said sample and allowing said sample to cool to produce a plurality of layers of film on said wafer.

6. A method of forming a film on a wafer, comprising the steps of:

depositing a soot on a wafer to form a sample;

sealing said sample inside a chamber of a microwave sintering furnace and surrounding said sample with an insulating material inside said chamber;

applying microwave radiation to said sample surrounded by said insulating material inside said chamber of said microwave sintering furnace to heat said sample by internal volumetric heating;

controlling a temperature of said sample for a predetermined amount of time, said step of controlling the temperature of said sample comprising the steps of:

measuring a temperature within a portion of said chamber that is surrounded by said insulating material to provide a measured temperature;

determining an error temperature as a difference between the measured temperature and a desired temperature; and modifying said microwave radiation applied by selectively adding and subtracting power from a current power level according to a function of the error temperature; and allowing said sample to cool.

7. The method of claim 4, further comprised of said flame hydrolysis deposition method comprising the step of:

exposing said wafer to a flame including any one of $SiCl_4$, $BCl_3$, $POCl_3$ and $GeCl_4$.

8. The method of claim 6, further comprised of said step of allowing said sample to cool comprising allowing said sample to cool to room temperature.

9. The method of claim 1, further comprised of said steps of applying microwave radiation and controlling a temperature of said sample being performed until particles of the soot are firmly combined with one another.

10. The method of claim 1, further comprised of said insulating material being a heat-resistant high temperature ceramic.

11. A method of forming a film on a wafer, comprising the steps of:

depositing a soot on a wafer to form a sample;

placing said sample in a microwave sintering furnace;

surrounding said sample with an insulating material inside said microwave sintering furnace;

applying microwave radiation to said sample surrounded by said insulating material inside said microwave sintering furnace to heat said sample by internal volumetric heating;

controlling a temperature of said sample by measuring a temperature within a portion of said microwave sintering furnace that is surrounded by said insulating material to provide a measured temperature and controlling said applying of said microwave radiation based upon the measured temperature to maintain a desired temperature for a predetermined amount of time; and allowing said sample to cool.

12. The method of claim 11, further comprised of said measuring a temperature to provide the measured temperature comprising using a temperature sensor located inside said portion of said microwave sintering furnace that is surrounded by said insulating material.

13. The method of claim 11, further comprised of said step of applying microwave radiation further comprising the step of controlling an atmosphere inside said microwave sintering furnace.

14. The method of claim 13, further comprised of said step of controlling the atmosphere comprising evacuating said microwave sintering furnace.

* * * * *